United States Patent [19]

Takahashi et al.

[11] Patent Number: 5,733,389
[45] Date of Patent: *Mar. 31, 1998

[54] METHOD OF MANUFACTURING A MICRO-ALLOY HIGH PURITY ALUMINUM CONDUCTOR FOR USE AT ULTRA LOW TEMPERATURE

[75] Inventors: Akihiko Takahashi, Ryugasaki; Hitoshi Yasuda, Tsukaba, both of Japan; Karl Theodore Hartwig, College Station; Lacy Clark McDonald, Bryan, both of Tex.

[73] Assignees: Sumitomo Chemical Co., Ltd., Osaka, Japan; Texas A & M University System, College Station, Tex.

[*] Notice: The term of this patent shall not extend beyond the expiration date of Pat. No. 5,616,191.

[21] Appl. No.: 443,754

[22] Filed: May 18, 1995

Related U.S. Application Data

[62] Division of Ser. No. 86,920, Jul. 7, 1993, abandoned.

[51] Int. Cl.⁶ .............................. C22F 1/04; H01L 39/12
[52] U.S. Cl. ........................ 148/535; 148/551; 148/562; 148/550; 505/812; 505/921; 29/599
[58] Field of Search ........................... 148/562, 404, 148/535–550, 551, 552; 505/812, 814, 921, 928, 929–930, 813, 918; 428/651, 652, 614, 660, 930; 29/599

[56] References Cited

U.S. PATENT DOCUMENTS

| | | |
|---|---|---|
| 3,211,547 | 10/1965 | Jarrett et al. . |
| 3,997,339 | 12/1976 | Fickelscher . |
| 4,166,755 | 9/1979 | Fister et al. . |
| 4,213,800 | 7/1980 | Mays et al. . |
| 4,537,642 | 8/1985 | Saito et al. . |
| 4,581,289 | 4/1986 | Dietrich et al. . |
| 4,609,408 | 9/1986 | Rodriques et al. ............ 148/552 |
| 4,659,007 | 4/1987 | Onishi et al. . |
| 4,711,825 | 12/1987 | Oberly et al. . |
| 5,189,386 | 2/1993 | Tada et al. . |
| 5,266,416 | 11/1993 | Inoue et al. . |
| 5,456,815 | 10/1995 | Fukuyo et al. ............ 204/298.13 |
| 5,466,312 | 11/1995 | Ward et al. ............ 148/552 |

FOREIGN PATENT DOCUMENTS

| | | |
|---|---|---|
| 56-136959 | 10/1981 | Japan . |
| 57-057856 | 4/1982 | Japan . |
| 59-056560 | 4/1984 | Japan . |
| 59-064754 | 4/1984 | Japan . |
| 60-155655 | 8/1985 | Japan . |
| 61-243159 | 10/1986 | Japan . |
| 63-224804 | 9/1988 | Japan . |
| 2066141 | 3/1990 | Japan . |

OTHER PUBLICATIONS

Robert E. Green, Jr. and Norman L. Newbern, "Continuous Growth of Single Crystal Aluminum Wires from the Melt", Transactions of The Metallurgical Society of Aime, Apr. 1962, vol. 224, New York, NY, USA, pp. 398–399.

P. Albert, O. Dimitrov and J. Le Hericy, "Etude de la recristallisation de l'aluminium de tres haute purete et de son influence sur la conductibilite electrique aux basses temperatures", Revue de Metallurgie, 1957, vol. 54, Paris, France, pp. 931–941.

05–287,465 Nov. 1993 JP.

44 23540 Jan. 1995 DE.

Takeo Fujiwara and Kunio Yamasaki "A Method of Producing a Long Single Crystal Plate of Aluminum with any Desired Crystallagraphic Plane" pp. 89–92 1939.

Niculescu et al, "Aluminum for cryoelectrotechnics", Institute of Electrical Engineers, Stevenage, GB, Inspec. No. 1730206, Studii SI Cercetari De Fizica, 1980, Romania, vol. 32, No. 9 — Abstract.

Woldman's Engineering Alloys, 6th Ed. p. 1764, 1979.

Metals Handbook, 9th Ed., vol. 15, pp. 319–323, 1988.

Superconducting Magnetic Energy Storage (SMES), vol. 1: Basic R&D 1984–85, Section 4, Parts A & B, pp. 4–1 through 4–99, Electric Power Research Institute, Research Project 2572–2 (Final Report, Nov. 1990).

*Primary Examiner*—David A. Simmons
*Assistant Examiner*—Margery S. Phipps
*Attorney, Agent, or Firm*—Cushman Darby & Cushman IP Group of Pillsbury Madison & Sutro, LLP

[57] ABSTRACT

A method for manufacturing an aluminum alloy conductor for use at ultra low temperature which involves the steps of adding at least one of the metallic and semimetallic effective elements selected from the group consisting of B, Ca, Ce, Ga, Y, Yb and Th, in a total amount of 6 to 200 weight ppm, into a previously prepared molten high purity aluminum having a purity of not less than 99.98 wt % to thereby obtain a molten metal mixture; casting the molten metal mixture to thereby obtain a casting; subjecting the casting to extrusion working at 150° C. to 350° C. in an area reduction ratio of 1:10 to 1:150 whereby an extrusion worked product is formed; and annealing the extrusion worked product at a temperature of 250° C. to 530° C. for 3 to 120 minutes, whereby an aluminum alloy conductor for use at ultra low temperature is obtained.

6 Claims, No Drawings

5,733,389

METHOD OF MANUFACTURING A MICRO-ALLOY HIGH PURITY ALUMINUM CONDUCTOR FOR USE AT ULTRA LOW TEMPERATURE

This is a division of application Ser. No. 08/086,920, filed Jul. 7, 1993, now abandoned.

FIELD OF THE INVENTION

The present invention relates to a high purity aluminum conductor used at ultra low temperature of 30° K or lower and a production process thereof, the aluminum conductor being used under those conditions where cyclic strain is given to it at ultra low temperature.

TECHNICAL BACKGROUND AND PRIOR ART

In those facilities and equipment which utilize a superconductor, a conductor, generally called a cryostatic stabilizer, is provided on and around the superconductor to protect the superconductor by-passing the electric current to the aluminum conductor around the superconductor region in the state of normal conductivity which occurs due to an external thermal, electric or magnetic disturbance.

The transition from the state of super-conductivity to the state of normal conductivity, which is usually called "QUENCING", results in current flow and $I^2R$ heat generation (wherein I means electric current and R means resistance of the conductor) in the region of the high purity aluminum.

High purity aluminum, because its electric resistivity is remarkably low at ultra low temperature and in magnetic field, has been discussed for possible use as such a cryostatic stabilizer, [F. R. Fickett, "Magnetro-resistance of Very Pure Polycrystalline Aluminum", Phy. Rev. B. Vol. 3, No. 6, 1971, p. 1941, "Superconducting Magnetic Energy Storage" Vol. 1: Basic R&D 1984–85, EPRI GS-7053, published by the Electric Power Research Institute in Nov. 1990.]

The use of a cryostatic stabilizer made of high purity aluminum is planned for Superconducting Magnetic Energy Storage (SMES) devices. In such facilities which store large quantities of electric power, hoop stresses are caused by the current flow through the magnet, and when electric charging and discharging are repeated, cyclic tensile stress and compressive stress may be given repeatedly to the superconductor and the cryostatic stabilizer.

It is known that such cyclic stress, which can include a plastic strain component at ultra low temperature, gives an adverse influence on high purity aluminum at ultra low temperature in the form of an increase in electric resistivity. [Advances in Cryogenic Engineering. 22, 486–489 (1976).]

Therefore, for those applications in which cyclic strain is given at ultra low temperature to the cryostatic stabilizer of high purity aluminum, the high purity aluminum conductor component ought to be of a relatively larger cross section in view of a possible increase in electric resistance of the cryostatic stabilizer when in use, or the conductor should be so designed as to reduce plastic strain of the cryostatic stabilizer under the same stress by increasing the design strength of the structural materials of SMES.

However, the above countermeasures require a large amount of materials when adopted for such large structures as utility scale SMES and are therefore very costly.

Further, it is known in the report of the international conference on Cryogenic materials, Applications and Properties, Shenyang, people's Republic of China, Jun. 7–10, 1988 that a high purity aluminum conductor used at ultra low temperature and its electric resistivity under cyclic strain does not remain low enough for the stabilizer if the cyclic strain range is too high. Table 3 of above report shows that at 4.2° K resistivity is 0.58 nΩcm before strain and 9.70 nΩcm after 3000 cycles of strain at ±0.1%.

SUMMARY OF THE INVENTION

An objective of the present invention resides in providing a high purity aluminum conductor used at ultra low temperature.

Another objective of the present invention resides in providing a production process for the aluminum conductor having the increase of its electric resistivity kept small under those conditions where cyclic strain is given at ultra low temperature. The present inventors made thorough studies about the development of the high purity aluminum condutor of which an increase in electric resistivity at ultra low temperature is kept small even after cyclic strain is given at ultra low temperature.

As a result, from the objective of the invention, the inventors found that the high purity alminum conductor with a purity of 99.98 to 99.9999 wt %, preferably 99.995 to 99.9999 wt %, containing at least one of metallic and semimetallic effective elements, has the increase of its electric resistivity kept small under those conditions where cyclic strain is given at ultra low temperature, and in addition, that the control of crystal orientation after the addition of the effective elements to the high purity aluminum conductor causes the increase of electric resistivity to be even smaller.

The inventors have found also that by controlling the crystal structure of the high purity aluminum conductor so as to consist of (i) a single crystal which has a specific crystal axis of <111> or <100>, or within an angle range of not greater than 10° in relation to the <111> or <100> axis in the longitudinal direction of the aluminum conductor, or (ii) a polycrystal most of which crystal grains have respective specific crystal axes, namely the <111> and/or <100> axes and/or the axes within an angle range of not greater than 10° in relation to the <111> or <100> axis, in the longitudinal direction of the aluminum conductor, and have specific crystal grain size, namely the mean crystal grain size is between 0.01 mm and 3.0 mm, the increase of electric resistance of the aluminum conductor can be kept small at ultra low temperature even after longitudinal cyclic strain is given at ultra low temperature.

DETAILED DESCRIPTION OF THE INVENTION

The invention is achieved by adding at least one effective element to high purity aluminum where purity is not less than 99.98 wt %, preferably not less than 99.995 wt %. Though higher purity is preferable, high purity aluminum with purity up to 99.9999 wt % can be used practically. The weight percentage of purity is calculated by the subtraction of Fe, Si and other metallic and nonmetallic elements, which are inevitably contained in high purity aluminum. Gases such as oxyen, hydrogen and chlorine may be neglected in the account of the purity.

In aluminum with a purity of less than 99.98 wt %, there are inevitably contained with impurities to high level, such as iron which increases electric resistivity. If the effective elements are added in addition to the such amount of inevitable impurities, the high purity aluminum conductor becomes much less desirable because resistivity of the conductor becomes too high, even though the conductor has the increase of its electric resistivity kept small under those conditions where cyclic strain is given at ultra low temperature.

The additive effective elements should be those which have the increase of electric resistivity of high purity aluminum kept small in room temperature, which atomic radius is largely different from that of aluminum, and which solid solubility into high purity aluminum is large and thus segregation is small during solidification, making the added elements work more effectively and the industrial worth greater.

Single or combined metallic or nonmetallic elements such as Ti, V, Cr, Mn, Fe, Co, Ni, Zr, Nb, Mo, Tc, Ru, Rh, Pd, Hf, Ta, W, Re, Os, Ir and Pt are not effective, because they cause a large increase in the electric resistivity of high purity aluminum at room temperature.

Other metallic and semimetallic elements except for the above mentioned elements are effective. Much more effective elements are Li, Na, Be, Mg, Ca, Y, Cu, Zn, B, Ga, Si, Ge, Pb, Bi, Lanthanide and Actinide. It is more preferable to use effective elements with at least one selected from the group consisting of B, Ca, Ce, Ga, Y, Yb and Th. Additions of less than 6 weight ppm of the additive elements is not effective. Not less than six weight ppm is preferable and ten weight ppm or greater is more preferable. Although 200 weight ppm are effective, but electric resistivity before the cyclic strain test is higher.

The total amount of the additive elements and impurities which are inevitably contained in high purity aluminum is preferably less than 200 weight ppm.

To make the high purity aluminum conductor containing the effective elements, the elements are added in a molten high purity aluminum by a conventional method. The molten aluminum metal is cast into a thick bar and shaped into a conductor by plastic working, such as conventional working methods of extrusion, drawing and rolling, or continuous casting into a thin conductor directly.

Because the amount of the additive effective elements are less than 200 weight ppm, most of those are in the state of solid solution at solidification and some are segregated in the cast blocks.

A homogenization treatment of the conductor, to reduce the segregation, at 450° to 650° C. for ten minutes to twenty hours is effective to enhance effects of the added elements. Also, a heat treatment of the conductor after the addition of the effective elements and optional homogenization treatment and optional plastic working of the thick bar are effective to enhance the effects of the additive elements. The heat treatment makes the additive elements attach to grain boundaries, subgrain boundaries and dislocation substructures inside the above processed high purity aluminum. The homogenization and the heat treatment are effective individually and the combination of the homogenization and the following heat treatment are more effective. The heat until the cooling from the higher temperature during and after the extrusion or the roll working process can also be used effectively as the heat treatment. The heat at soldering of a superconductor to attach the cryostatic stabilizer can be used. The preferable conditions for the heat treatment is to maintain at 250° to 530° C. for 3 to 120 minutes.

Furthermore, the inventors have found that a specific crystal orientation of the high purity aluminum conductor causes the increase of electric resistivity to be kept small even after cyclic strain is given at ultra low temperature. This means that the control of crystal orientation of the high purity aluminum conductor containing the additive effective elements further reduces the increase of electric resistivity.

Much more effective results are obtained by adding effective elements to the aluminum conductor consisting of a veritable single crystal or a substantially single crystal which has a specific crystal axis of <100> or <111>, within an angle range of not greater than 10° in relation to the <100> or <111> axis in the longitudinal direction of the aluminum conductor.

And the same effective results are obtained by adding effective elements to the aluminum conductor consisting of a polycrystal most of which crystal grains have specific crystal axes, namely the <111> and/or <100> axis and/or the crystal axes within an angle range of not greater than 10° in relation to the <111> or <100> axis with respect to each grain, in the longitudinal direction of the aluminum conductor.

As evident from Tables 1 and 2, after cyclic strain is given 3,000 times at ultra low temperature, the high purity aluminum in the invention has lower electric resistivity in liquid helium than the aluminum used in the comparative example and the aluminum aforementioned in the last paragraph of "TECHNICAL BACKGROUND AND PRIOR ART". Thus, the high purity aluminum in the invention has excellent characteristics as a cryostatic stabilizer used at ultra low temperature.

Here, regarding the crystal structure of the high purity aluminum, a detailed description is provided as follows.

A veritable single crystal can be produced by the method of strain anneal crystal growth. The Bridgemen method, Chalmers method or Czochralski method, which uses an oriented seed crystal, can be adopted for obtaining an aluminum conductor consisting of a substantially single crystal which has the <111> or <100> axis, or the crystal axes within an angle range of not greater than 10° in relation to the <111> or <100> axis in the longitudinal direction of the aluminum conductor. A very low speed particular continuous casting method can be adopted for obtaining an aluminum conductor consisting of the substantially single crystal.

A polycrystal made of a bundle of grains each of which is rather columnar and is almost as long as the length of the aluminum conductor in the longitudinal directions of the conductor has the same effects as the substantially single crystal, and which has specific and effective orientation mentioned above. And the same low speed paticular continuous casting method can be adopted for obtaining such a bundle of grains.

A polycrystal, consisting of very coarse crystal grains, each of which is (i) as long as the diameter of the aluminum conductor in the lateral direction of the conductor and is (ii) lined one after another in the longitudinal direction of the conductor, and most of which grains have the <111> and/or <100> axis and/or the crystal axes within an angle range of not greater than 10° in relation to the <111> or <100> axis, respectively, in the longitudinal direction of the conductor, can work in a manner similar to the single crystal mentioned above as a high purity aluminum conductor for use at ultra low temperature in the invention.

Further, an aluminum conductor consisting of a polycrystal, most of which crystal grains have the <111> and/or <100> axis and/or the crystal axes within an angle range of not greater than 10° in relation to the <111> or <100> axis, respectively, in the longitudinal direction of the aluminum conductor and have mean grain size between 0.01 mm and 3.0 mm, preferably 0.01 to 2.0 mm, also works effectively as a high purity aluminum used at ultra low temperature in this invention. An extrusion crystal texture or re-crystallized texture is suitable for such a polycrystal. In this invention, such extrusion crystal texture or re-crystallized texture can be obtained by extrusion working of high purity aluminum at 150° C. to 350° C. and in area reduction ratio of 1/10 to 1/150, preferably 1/20 to 1/100, optionally cooling it to room temperature, subsequently heating it up to a temperature range of from 250° C. to 530° C. and holding it at the temperature for 10 min. to 120 min..

EXAMPLE

B, Ca, Ce, Ga and Y were added respectively, as shown in Table 1, to high purity aluminum of 99.9998 wt % which was melted and kept at 750° C. The molten aluminum metal was cast into a graphite mold with a size of 65×35×120 mm. The cast block was homogenized at 600° C. for ten hours, rolled to make a plate with a thickness of 14 mm and finally annealed at 350° C. for ten minutes. The sample rods of 10 mm in diameter and 150 mm in length, which were obtained by machining from the thick plate, were heated at 250° C. for two hours and the residual stresses were released from their surfaces. Then, the samples were soaked, with jigs into liquid helium, and those electric resistivities were measured at 4.2° K of ultra low temperature by the eddy current decay method.

Further, the 150 mm length samples were given 0.1% tensile strain and compressive strain 3,000 times with the temperature kept at 4.2° K, thereafter those electric resistivity were measured in the liquid helium by the eddy current decay method in the same manner as mentioned in the above paragraph. The results are shown in Table 1.

TABLE 1

| Additive element | Amount (wt. ppm) | Residual electric resistivity at 4.2° K. (nΩcm) | |
|---|---|---|---|
| | | Before strain | After 3,000 cycles of ±0.1% strain at 4.2° K. |
| B | 20 | 0.45 | 6.23 |
| B | 70 | 0.62 | 6.49 |
| Ca | 20 | 0.36 | 6.07 |
| Ce | 20 | 0.34 | 5.85 |
| Ce | 90 | 0.41 | 6.03 |
| Ga | 20 | 0.55 | 6.21 |
| Y | 20 | 0.72 | 6.74 |

COMPARATIVE EXAMPLE

Test pieces were made in the same manner as mentioned in example 1 except that the amount of its added elements were 5 weight ppm respectively, and the results are shown in Table 2.

TABLE 2

| Additive element | Amount (wt. ppm) | Residual electric resistivity at 4.2° K. (nΩcm) | |
|---|---|---|---|
| | | Before strain | After 3,000 cycles of ±0.1% strain at 4.2° K. |
| B | 5 | 0.29 | 7.76 |
| Ca | 5 | 0.41 | 8.05 |
| Ga | 5 | 0.28 | 7.40 |
| Y | 5 | 0.44 | 8.00 |

What is claimed is:

1. A method of manufacturing an aluminum alloy conductor for use at ultra low temperature, wherein the method consists essentially of the steps of:

adding at least one of the metallic and semimetallic effective elements selected from the group consisting of B, Ca, Ce, Ga, Y, Yb and Th, in a total amount of 6 to 200 weight ppm, into a previously prepared molten high purity aluminum having a purity of not less than 99.98 wt % to thereby obtain a molten metal mixture;

casting the molten metal mixture to thereby obtain a casting;

subjecting the casting to extrusion working at 150° C. to 350° C. in an area reduction ratio of 1:10 to 1:150 whereby an extrusion worked product is formed; and annealing the extrusion worked product at a temperature of 250° C. to 530° C. for 3 to 120 minutes, whereby an aluminum alloy conductor for use at ultra low temperature is obtained.

2. A method according to claim 1, wherein the annealing is performed at qa temperature of 350° C. to 530° C. for 3 to 120 minutes.

3. A method of manufacturing an aluminum alloy conductor for use at ultra low temperature, wherein the method consists essentially of the steps of adding at least one of the metallic and semimetallic effective elements selected from the group consisting of B, Ca, Ce, Ga, Y, Yb and Th, in a total amount of 6 to 200 weight ppm, into a previously prepared molten high purity aluminum having a purity of not less than 99.98 wt % to thereby obtain a molten metal mixture;

casting the molten metal mixture to thereby obtain a casting;

subjecting the casting to a homogenization treatment at 450° C. to 650° C. for ten minutes to twenty hours to thereby obtain a homgenized product;

subjecting the homogenized product to extrusion working at 150° C. to 350° C. in an area reduction ratio of 1:10 to 1:150 to thereby obtain a worked product; and annealing the extrusion worked product at a temperature of 250° C. to 530° C. for 3 to 120 minutes, whereby an aluminum alloy conductor for use at ultra low temperature is obtained.

4. A method according to claim 3, wherein the annealing is performed at a temperature of 350° C. to 530° C. for 3 to 120 minutes.

5. A method of manufacturing a cryostatic stabilizer capable of being used at ultra low temperature, wherein the method consists essentially of the steps of:

adding at least one of the metallic and semimetallic effective elements selected from the group consisting of B, Ca, Ce, Ga, Y, Yb and Th, in a total amount of 6 to 200 weight ppm, into a previously prepared molten high purity aluminum having a purity of not less than 99.98 wt % to thereby obtain a molten metal mixture;

casting the molten metal mixture to thereby obtain a casting;

subjecting the casting to a homogenization treatment at a temperature of 450° C. to 650° C. for ten minutes to twenty hours to thereby obtain a homogenized product;

subjecting the homogenized product to extrusion working at 150° C. to 350° C. in an area reduction ratio of 1:10 to 1:150 to thereby obtain an extrusion worked product;

annealing the extrusion worked product at a temperature of of 250° C. to 530° C. for 3 to 120 minutes to thereby obtain an annealed product; and providing a superconductor and providing the annealed product on and around said superconductor.

6. A method according to claim 5, wherein the annealing is performed at 350° C. to 530° C. for 3 to 120 minutes.

* * * * *